United States Patent
Hayashi et al.

(10) Patent No.: US 9,065,011 B2
(45) Date of Patent: Jun. 23, 2015

(54) THERMOELECTRIC CONVERSION ELEMENT, THERMOELECTRIC CONVERSION MODULE, METHOD FOR PRODUCING THERMOELECTRIC CONVERSION ELEMENT

(75) Inventors: Sachiko Hayashi, Moriyama (JP); Takanori Nakamura, Omihachiman (JP)

(73) Assignee: Murata Manufacturing Co., Ltd., Kyoto (JP)

(*) Notice: Subject to any disclaimer, the term of this patent is extended or adjusted under 35 U.S.C. 154(b) by 188 days.

(21) Appl. No.: 12/637,855

(22) Filed: Dec. 15, 2009

(65) Prior Publication Data

US 2010/0116308 A1  May 13, 2010

Related U.S. Application Data

(63) Continuation of application No. PCT/JP2008/060851, filed on Jun. 13, 2008.

(30) Foreign Application Priority Data

Jun. 22, 2007 (JP) .................................. 2007-164523

(51) Int. Cl.
*H01L 35/22* (2006.01)
*H01L 35/32* (2006.01)

(52) U.S. Cl.
CPC ................ *H01L 35/22* (2013.01); *H01L 35/32* (2013.01)

(58) Field of Classification Search
None
See application file for complete search history.

(56) References Cited

U.S. PATENT DOCUMENTS 2,981,775 A * 4/1961 Bachman ..................... 136/227
4,032,363 A * 6/1977 Raag .............................. 136/211

(Continued)

FOREIGN PATENT DOCUMENTS

| EP | 0 288 212 A1 | 10/1988 |
|---|---|---|
| EP | 0 685 893 A1 | 12/1995 |

(Continued)

OTHER PUBLICATIONS

Seok, et al. The effect of Cu-sites doping on electrical properties of La2CuO4 as thermoelectric material. Journal of Materials Science: Materials in Electronics. (1995). vol. 6. 140-143.*

(Continued)

*Primary Examiner* — Jennifer Michener
*Assistant Examiner* — Christopher Danicic
(74) *Attorney, Agent, or Firm* — Keating & Bennett, LLP

(57) ABSTRACT

A thermoelectric conversion element, a thermoelectric conversion module, and a method for producing a thermoelectric conversion element are provided, each of the element and the module having a low contact resistance between a p-type thermoelectric conversion material and an n-type thermoelectric conversion material and being capable of being used at high temperatures without deterioration due to oxidation. A p-type oxide thermoelectric conversion material is primarily made of a substance having a layered perovskite structure represented by the formula: $A_2BO_4$, wherein A includes at least La, and B represents at least one element including at least Cu. An n-type oxide thermoelectric conversion material is primarily made of a substance having a layered perovskite structure represented by the formula: $D_2EO_4$, wherein D includes at least one of Pr, Nd, Sm, and Gd, and E represents at least one element including at least Cu. The p-type oxide thermoelectric conversion material, the n-type oxide thermoelectric conversion material, and a composite insulating material are co-sintered. A glass having a softening point of about 550° C. to about 750° C. is used as a glass defining the composite insulating material.

4 Claims, 5 Drawing Sheets

(56) References Cited

U.S. PATENT DOCUMENTS

| | | | |
|---|---|---|---|
| 5,009,717 A * | 4/1991 | Komabayashi et al. | 136/201 |
| 5,352,299 A | 10/1994 | Yoshimoto et al. | |
| 2003/0000938 A1 * | 1/2003 | Zhou | 219/466.1 |
| 2007/0237935 A1 * | 10/2007 | Mori et al. | 428/210 |

FOREIGN PATENT DOCUMENTS

| | | | | |
|---|---|---|---|---|
| EP | 0685893 A1 * | 12/1995 | | H01L 35/32 |
| JP | 04-199755 A | 7/1992 | | |
| JP | 06-017225 A | 1/1994 | | |
| JP | 08-032128 A | 2/1996 | | |
| JP | 11-121815 A | 4/1999 | | |
| JP | 2000-012914 | * | 1/2000 | H01L 35/22 |
| JP | 2000-012914 A | 1/2000 | | |
| JP | 2001-057448 A | 2/2001 | | |
| JP | 2001-217469 A | 8/2001 | | |
| JP | 2002-118300 A | 4/2002 | | |
| JP | 2005-223307 A | 8/2005 | | |

OTHER PUBLICATIONS

Takagi, Atsushi, and Mayuho Kaikawa. "Preparation and Properties of Rare-Earth System Oxide Thermoelectric Material." Aichi Industrial University Research Report, No. 41A, 2006.*

Takagi, Atsushi, and Mayuho Kaikawa. "Preparation and Properties of Rare-Earth System Oxide Thermoelectric Material." Aichi Industrial University Research Report, No. 41A, 2006. Partial English Translation.*

Macklin, W et al, "On the Use of Oxides for Thermoelectric Refrigeration", Materials Science and Engineering, B7 (1990), p. 111-117.*

Official Communication issued in International Patent Application No. PCT/JP2008/060851, mailed on Jul. 15, 2008.

Official Communication issued in corresponding Chinese Patent Application No. 200880021042.6, mailed on Jul. 12, 2011.

* cited by examiner

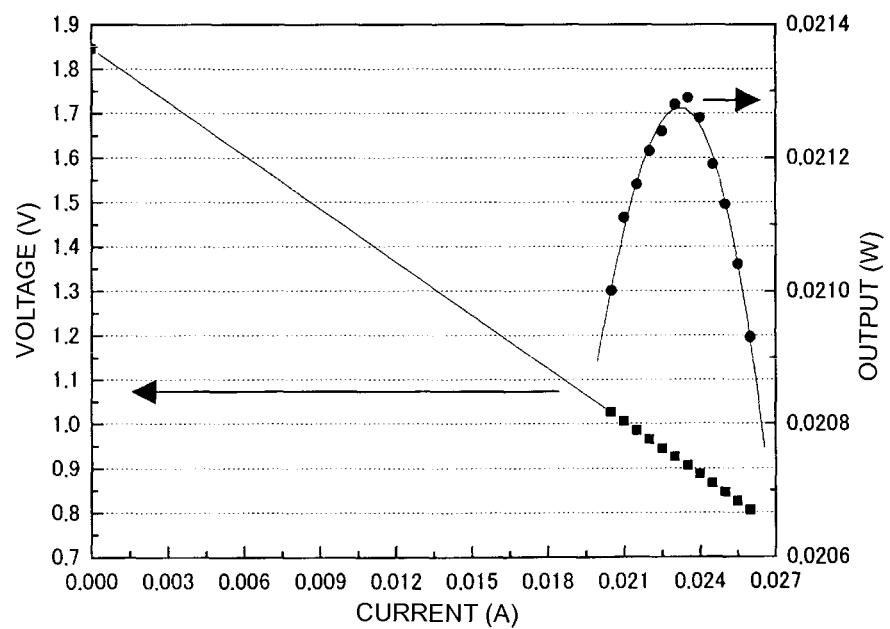

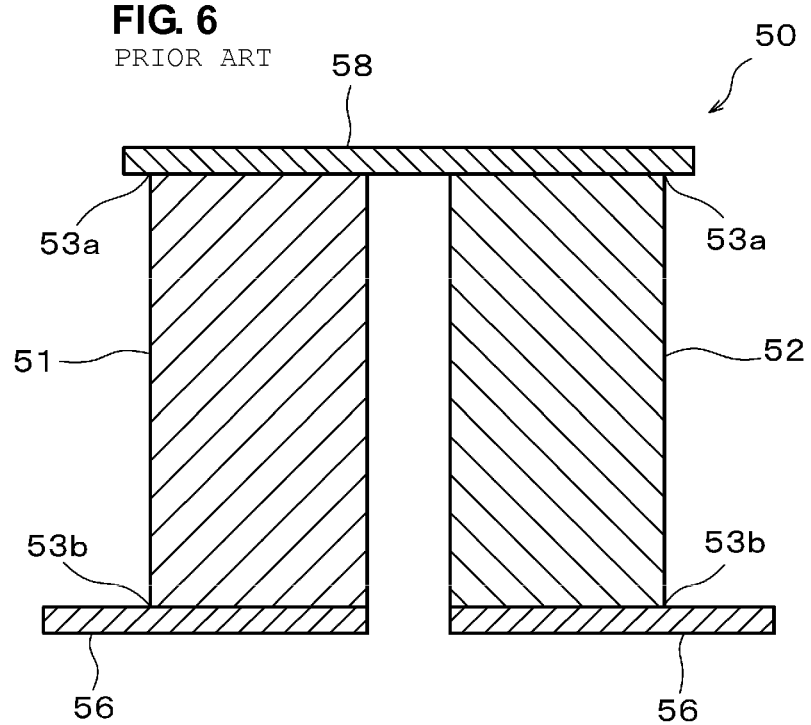

THERMOELECTRIC CONVERSION ELEMENT, THERMOELECTRIC CONVERSION MODULE, METHOD FOR PRODUCING THERMOELECTRIC CONVERSION ELEMENT

BACKGROUND OF THE INVENTION

1. Field of the Invention

The present invention relates to a thermoelectric conversion element, a thermoelectric conversion module, and a method for producing a thermoelectric conversion element.

2. Description of the Related Art

To prevent global warming, the reduction of carbon dioxide is a critical issue. Thermoelectric conversion elements capable of directly converting heat into electricity have recently been receiving attention as one effective technique of utilizing waste heat.

For example, as shown in FIG. 6, a thermoelectric conversion element 50 including a p-type thermoelectric conversion material 51, an n-type thermoelectric conversion material 52, lower-temperature-side electrodes 56, and a higher-temperature-side electrode 58 is known as a conventional thermoelectric conversion element.

In the thermoelectric conversion element 50, two types of thermoelectric conversion materials 51 and 52 are provided for energy conversion between heat and electricity and are connected to the lower-temperature-side electrodes 56 at lower-temperature-side junctions 53b, which are defined by end surfaces on a lower-temperature side. Furthermore, the thermoelectric conversion materials 51 and 52 are connected to each other at higher-temperature-side junctions 53a, which are end surfaces on a higher-temperature side, with the higher-temperature-side electrode 58. In the thermoelectric conversion element 50, the application of a temperature difference between the higher-temperature-side junctions 53a and the lower-temperature-side junctions 53b generates an electromotive force caused by the Seebeck effect, thereby providing electricity.

However, in the thermoelectric conversion element 50, the electrodes 56 and 58 are used to connect the two thermoelectric conversion materials 51 and 52, thereby disadvantageously producing contact resistance between the electrodes and the thermoelectric conversion materials.

The electric-generating capacity of a thermoelectric conversion element is determined by thermoelectric conversion characteristics of a material and a temperature difference applied to the element, and is also significantly affected by the occupancy of the thermoelectric conversion materials, that is, by the proportion of the area of the thermoelectric conversion materials in a plane perpendicular to the direction of the temperature difference applied to the thermoelectric conversion element. A higher occupancy of the thermoelectric conversion materials leads to an increase in the electric-generating capacity of the thermoelectric conversion element per unit area.

However, in an exemplary conventional structure, such as the thermoelectric conversion element 50, a gap insulation layer is provided between the two thermoelectric conversion materials 51 and 52. Thus, the extent to which the occupancy of the thermoelectric conversion materials can be increased is limited.

Furthermore, since the insulation gap is provided between the two thermoelectric conversion materials 51 and 52, the element is susceptible to damage due to impact by, for example, dropping. Thus, the element disadvantageously has low reliability.

As described above, a higher occupancy of the thermoelectric conversion materials is desirable to increase the electric-generating capacity of the thermoelectric conversion element. As a method for overcoming the foregoing problems, a thermoelectric conversion element including p-type and n-type thermoelectric conversion materials that are directly bonded has been disclosed (see, for example, Japanese Unexamined Patent Application Publication No. 8-32128 and Japanese Unexamined Patent Application Publication No. 2002-118300).

In the direct-junction thermoelectric conversion elements disclosed in Japanese Unexamined Patent Application Publication No. 8-32128 and Japanese Unexamined Patent Application Publication No. 2002-118300, the p-type and n-type thermoelectric conversion materials are directly bonded, and there is no need to provide a gap therebetween. Thus, the occupancy of the thermoelectric conversion materials is increased.

That is, Japanese Unexamined Patent Application Publication No. 8-32128 discloses a thermoelectric conversion element in which p-type and n-type thermoelectric conversion materials are alternately stacked, the p-type and n-type thermoelectric conversion materials are electrically connected, and an insulating layer is arranged in a region other than a junction region of a stack interface. The insulating layer is formed by firing a mixed material including at least one insulating ceramic materials selected from the group consisting of $ZrO_2$, $Al_2O_3$, $MgO$, $TiO_2$, and $Y_2O_3$ and a glass containing $SiO_2$, $B_2O_3$, $Al_2O_3$, and an alkaline-earth metal oxide, the glass content of the mixed material being in the range of 10% to 50% by weight. The p-type and n-type thermoelectric conversion materials are obtained by firing a modified iron silicide ($FeSi_2$).

However, in the thermoelectric conversion element disclosed in Japanese Unexamined Patent Application Publication No. 8-32128, an iron silicide ($FeSi_2$)-based material is used as the thermoelectric conversion material. Thus, a special firing method in which firing is performed in a vacuum is required, which disadvantageously increases the cost and complexity of the production process. Furthermore, the iron silicide-based material has a high thermal conductivity, which disadvantageously causes difficulty in applying a temperature difference to the thermoelectric conversion element. Moreover, the iron silicide-based material may be deteriorated by oxidation occurring at a high temperature.

Another thermoelectric conversion element is disclosed in which p-type and n-type semiconductor materials are bonded by charging at least two different oxide semiconductor powders into a die so as to form at least two layers and performing spark plasma sintering under pressure (see, for example, Japanese Unexamined Patent Application Publication No. 2002-118300).

In the thermoelectric conversion element disclosed in Japanese Unexamined Patent Application Publication No. 2002-118300, although oxide thermoelectric conversion materials are used as the thermoelectric conversion materials, for example, a modified material of ZnO having a wurtzite structure is used as the n-type thermoelectric conversion material, and NiO having a tetragonal structure is used as the p-type thermoelectric conversion material. They have different sintering temperatures. Thus, it is necessary to perform sintering under pressure. Similar to Japanese Unexamined Patent Application Publication No. 8-32128, there are problems of increased cost and complexity of the production process.

In addition, a thermoelectric material having a composition of the chemical formula $(La_{1-x}Ba_x)_2CuO_4$, $(La_{1-x}Sr_x)_2CuO_4$, or $(Y_{1-x}Ba_x)_2CuO_4$ is reported (Japanese Examined Patent Application Publication No. 6-17225) as a thermoelectric conversion material defining a thermoelectric conversion element, wherein x is in the range of 0<x<1. Japanese Examined Patent Application Publication No. 6-17225 also discloses that the firing of the thermoelectric material is performed at 1100° C. for 5 hours.

Furthermore, a thermoelectric conversion material formed by doping a complex oxide of the chemical formula $Nd_2CuO_4$ with Zr or Pr is disclosed as a thermoelectric conversion material defining a thermoelectric conversion element (see, for example, Japanese Unexamined Patent Application Publication No. 2000-12914). Japanese Unexamined Patent Application Publication No. 2000-12914 also discloses that the firing of the thermoelectric material is performed at 1100° C. for 10 hours.

In the conventional techniques disclosed in Japanese Examined Patent Application Publication No. 6-17225 and Japanese Unexamined Patent Application Publication No. 2000-12914, the compositions and the firing conditions of the oxides defining the thermoelectric conversion materials are described. However, with respect to a combination of the n-type and p-type thermoelectric conversion materials and a method for directly bonding the n-type and p-type thermoelectric conversion materials, which are required to produce a small, high-performance thermoelectric conversion element, no specific description is provided.

SUMMARY OF THE INVENTION

To overcome the problems described above, preferred embodiments of the present invention provide a thermoelectric conversion element including a high occupancy of thermoelectric conversion materials using a p-type oxide thermoelectric conversion material and an n-type oxide thermoelectric conversion material, the p-type oxide thermoelectric conversion material and the n-type oxide thermoelectric conversion material being directly bonded, and a thermoelectric conversion element and a thermoelectric conversion module, which have small sizes, high performance, and good impact resistance which can be used at high temperatures without deterioration due to oxidation, and a method for producing a thermoelectric conversion element.

A thermoelectric conversion element according to a preferred embodiment of the present invention includes a p-type oxide thermoelectric conversion material and an n-type oxide thermoelectric conversion material, in which the p-type oxide thermoelectric conversion material is directly bonded to the n-type oxide thermoelectric conversion material in one region of a junction surface between the p-type oxide thermoelectric conversion material and the n-type oxide thermoelectric conversion material, and the p-type oxide thermoelectric conversion material is bonded to the n-type oxide thermoelectric conversion material with an insulating material provided therebetween in another region of the junction surface, and in which the p-type oxide thermoelectric conversion material, the n-type oxide thermoelectric conversion material, and the insulating material are co-sintered.

The p-type oxide thermoelectric conversion material, the n-type oxide thermoelectric conversion material, and the insulating material are preferably co-sintered in air, for example.

The p-type oxide thermoelectric conversion material is preferably primarily made of a substance having a layered perovskite structure represented by the formula: $A_2BO_4$ (wherein A includes at least La; and B represents one or a plurality of elements including at least Cu), for example, and the n-type oxide thermoelectric conversion material is preferably primarily made of a substance having a layered perovskite structure represented by the formula: $D_2EO_4$ (wherein D includes at least one of Pr, Nd, Sm, and Gd; and E represents one or a plurality of elements including at least Cu), for example.

The insulating material is preferably an oxide and a glass, for example.

The glass preferably has a softening point of about 550° C. to about 750° C., for example.

A thermoelectric conversion module according to a preferred embodiment of the present invention includes a plurality of thermoelectric conversion elements.

A method for producing a thermoelectric conversion element according to another preferred embodiment of the present invention includes the steps of forming a p-type oxide thermoelectric conversion material sheet, forming an n-type oxide thermoelectric conversion material sheet, arranging an insulating material in a first region other than a second region of the junction surface between the p-type oxide thermoelectric conversion material sheet and the n-type oxide thermoelectric conversion material sheet, forming a laminate such that the p-type oxide thermoelectric conversion material sheet is directly bonded to the n-type oxide thermoelectric conversion material sheet in the second region in which the insulating material is not arranged when the p-type oxide thermoelectric conversion material sheet and the n-type oxide thermoelectric conversion material sheet are stacked and such that the p-type oxide thermoelectric conversion material sheet is bonded to the n-type oxide thermoelectric conversion material sheet with the insulating material provided therebetween in the first region in which the insulating material is arranged, and co-firing the laminate to co-sinter the p-type oxide thermoelectric conversion material, the n-type oxide thermoelectric conversion material, and the insulating material.

The p-type oxide thermoelectric conversion material, the n-type oxide thermoelectric conversion material, and the insulating material are preferably co-sintered in air, for example.

The p-type oxide thermoelectric conversion material is preferably primarily made of a substance having a layered perovskite structure represented by the formula: $A_2BO_4$ (wherein A contains at least La; and B represents one or a plurality of elements containing at least Cu), for example, and the n-type oxide thermoelectric conversion material is preferably primarily made of a substance having a layered perovskite structure represented by the formula: $D_2EO_4$ (wherein D contains at least one of Pr, Nd, Sm, and Gd; and E represents one or a plurality of elements containing at least Cu), for example.

The insulating material preferably includes an oxide and a glass, for example.

The glass has a softening point of about 550° C. to about 750° C., for example.

In the thermoelectric conversion element according to various preferred embodiments of the present invention, the p-type oxide thermoelectric conversion material is directly bonded to the n-type oxide thermoelectric conversion material in one region of the junction surface between the p-type oxide thermoelectric conversion material and the n-type oxide thermoelectric conversion material. The p-type oxide thermoelectric conversion material is bonded to the n-type oxide thermoelectric conversion material with the insulating material provided therebetween in another region of the junction surface. This results in an increase in the occupancy of the thermoelectric conversion materials, an increase in electric-generating capacity, and a reduction in resistance at a junction portion as compared to the conventional case in which a p-type thermoelectric conversion material is connected to an n-type thermoelectric conversion material with an electrode.

Furthermore, the p-type oxide thermoelectric conversion material and the n-type oxide thermoelectric conversion material are bonded directly or with the insulating material provided therebetween, so that they are securely bonded at the junction surface, which improves the impact resistance. Moreover, the thickness of the insulating layer can be reduced as compared to a conventional thermoelectric conversion element having an insulation gap, thereby achieving greater packaging density.

In the thermoelectric conversion element according to various preferred embodiments of the present invention, the p-type oxide thermoelectric conversion material, the n-type oxide thermoelectric conversion material, and the insulating material may preferably be co-sintered in air, for example. In this case, the production process can be simplified so as to produce a thermoelectric conversion element at low cost.

In the method for producing a thermoelectric conversion element according to preferred embodiments of the present invention, the laminate is provided in which the p-type oxide thermoelectric conversion material is directly bonded to the n-type oxide thermoelectric conversion material in the region in which the insulating material is not arranged and in which the p-type oxide thermoelectric conversion material sheet is bonded to the n-type oxide thermoelectric conversion material sheet with the insulating material provided therebetween in the region where the insulating material is arranged. The laminate is co-fired to co-sinter the p-type oxide thermoelectric conversion material, the n-type oxide thermoelectric conversion material, and the insulating material. Thus, a thermoelectric conversion element in which the p-type thermoelectric conversion material is directly bonded to the n-type thermoelectric conversion material is produced, such that the element has a high occupancy of the thermoelectric conversion materials.

When the p-type oxide thermoelectric conversion material is primarily made of a substance having a layered perovskite structure represented by the formula: $A_2BO_4$ (wherein A contains at least La; and B represents one or a plurality of elements containing at least Cu), the n-type oxide thermoelectric conversion material is primarily made of a substance having a layered perovskite structure represented by the formula: $D_2EO_4$ (wherein D contains at least one of Pr, Nd, Sm, and Gd; and E represents one or a plurality of elements containing at least Cu), and the insulating material includes an oxide and a glass, the p-type oxide thermoelectric conversion material, the n-type oxide thermoelectric conversion material, and the insulating material can be co-sintered in air and a thermoelectric conversion element having a high occupancy of the thermoelectric conversion materials can be produced.

Furthermore, when co-firing the p-type and n-type thermoelectric conversion materials, the foregoing materials exhibit similar shrinking behavior during firing, thus preventing the occurrence of failures, such as cracking and delamination of the p-type and n-type thermoelectric conversion materials, and further reducing the contact resistance between the p-type thermoelectric conversion material and the n-type thermoelectric conversion material.

Moreover, the insulating material including an oxide and a glass the sinterability of the insulating material compatible with the p-type and n-type thermoelectric conversion materials. Thus, the p-type thermoelectric conversion material, the n-type thermoelectric conversion material, and the insulating material can be co-fired without using a special firing method or atmosphere.

In the thermoelectric conversion element according to various preferred embodiments of the present invention, each of the p-type thermoelectric conversion material, the n-type thermoelectric conversion material, and the insulating material is preferably an oxide material, and a connection electrode is not used. Thus, the element can be used at high temperatures without deterioration caused by oxidation.

When co-sintering the p-type oxide thermoelectric conversion material, the n-type oxide thermoelectric conversion material, and the insulating material, gaps between the materials are eliminated, thus, significantly increasing the bonding strength. Furthermore, co-sintering eliminates the need for a step of bonding the materials. Moreover, a connection electrode and a step of forming the connection electrode are not required, which reduces the production cost.

When the glass defining the insulating material has a softening point of about 550° C. to about 750° C., the diffusion of components of the insulating layer into a thermoelectric conversion material is prevented. Thus, a thermoelectric conversion element having outstanding characteristics can be produced.

Furthermore, the thermoelectric conversion module according to various preferred embodiments of the present invention preferably includes a plurality of the thermoelectric conversion elements having greater packaging density and higher strength. Thus, a small, high-performance thermoelectric conversion module having a low contact resistance between the thermoelectric conversion materials can be produced.

Other elements, features, steps, characteristics and advantages of the present invention will become more apparent from the following detailed description of the preferred embodiments with reference to the attached drawings.

BRIEF DESCRIPTION OF THE DRAWINGS

FIG. 5 shows output characteristics of the thermoelectric conversion element according to a preferred embodiment of the present invention under conditions in which the temperature of an upper surface is about 400° C. and the temperature of a lower surface is about 20° C.

FIG. 6 shows a conventional thermoelectric conversion element.

DETAILED DESCRIPTION OF PREFERRED EMBODIMENTS

Preferred embodiments of the present invention will be shown below with reference to the drawings.

First Preferred Embodiment

Figure 1:
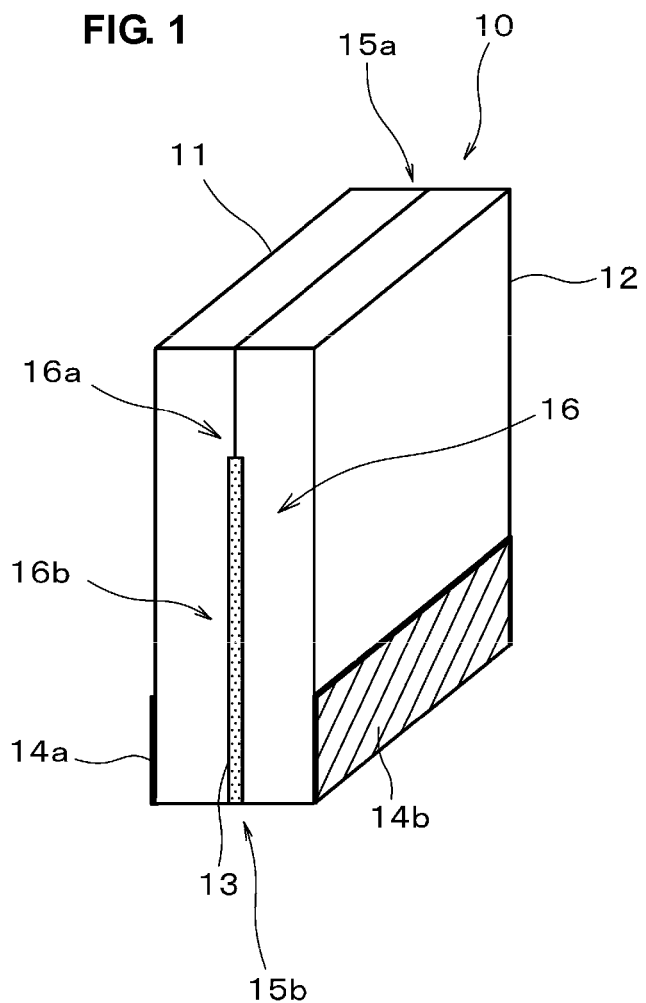
FIG. 1 shows a thermoelectric conversion element according to a first preferred embodiment of the present invention.

FIG. 1 shows a thermoelectric conversion element 10 according to a first preferred embodiment of the present invention. As shown in FIG. 1, the thermoelectric conversion element 10 according to the first preferred embodiment includes a p-type thermoelectric conversion material 11 (hereinafter, referred to as a "p-type oxide thermoelectric conversion material") preferably primarily made of an oxide, for example, and an n-type thermoelectric conversion material 12 (hereinafter, referred to as an "n-type oxide thermoelectric conversion material") preferably primarily composed of an oxide, for example.

In the thermoelectric conversion element 10 according to the first preferred embodiment, the p-type oxide thermoelectric conversion material 11 is directly bonded to the n-type oxide thermoelectric conversion material 12 without an electrode or other element provided therebetween in one region 16a of the junction surface 16 between the p-type oxide thermoelectric conversion material 11 and the n-type oxide thermoelectric conversion material 12. In another region 16b other than the one region 16a of the junction surface 16, the p-type oxide thermoelectric conversion material 11 is bonded to the n-type oxide thermoelectric conversion material 12 with an insulating material 13 (composite insulating material) including an oxide and a glass provided therebetween.

A first electrode 14a arranged to output electric power is arranged at a lower portion of the p-type oxide thermoelectric conversion material 11. A second electrode 14b arranged to output electric power is arranged at a lower portion of the n-type oxide thermoelectric conversion material.

In the thermoelectric conversion element 10 according to the first preferred embodiment, a higher-temperature-side junction 15a is defined as the side on which the p-type oxide thermoelectric conversion material 11 is directly bonded to the n-type oxide thermoelectric conversion material 12. A lower-temperature-side junction 15b is defined as the side on which the first and second electrodes 14a and 14b are arranged.

In the thermoelectric conversion element 10 according to the first preferred embodiment, each of the p-type oxide thermoelectric conversion material 11 and the n-type oxide thermoelectric conversion material 12 is preferably primarily made of an oxide, for example.

The p-type oxide thermoelectric conversion material is preferably primarily made of a substance having a layered perovskite structure represented by the formula: $A_2BO_4$, for example.

In the formula $A_2BO_4$ of the p-type oxide thermoelectric conversion material 11, A preferably includes La (lanthanum), for example. Furthermore, A is preferably substituted by Sr in the form of $A_{2-x}Sr_x$, provided that $0 \leq x < 0.2$. The selection of La as A enables the production of the p-type thermoelectric conversion material. In addition, the substitution of Sr for A in the range of $0 \leq x < 0.2$ results in a reduction in the resistance of the material. At a Sr content of about 0.2 or more, although the effect of reducing resistance is provided, a Seebeck coefficient is low, which generates only a low electromotive force.

B represents one or a plurality of elements preferably including at least Cu, for example.

The n-type oxide thermoelectric conversion material is preferably primarily made of a substance having a layered perovskite structure represented by the formula: $D_2EO_4$ for example.

In the formula $D_2EO_4$ of the n-type oxide thermoelectric conversion material 12, D preferably includes at least one of Pr (praseodymium), Nd (neodymium), Sm (samarium), and Gd (gadolinium), for example.

Furthermore, D is preferably substituted by Ce in the form of $D_{2-y}Ce_y$, provided that $0 \leq y < 0.2$. The selection of at least one of Pr, Nd, Sm, and Gd as D permits the production of the n-type thermoelectric conversion material. In addition, the substitution of Ce for B in the range of $0 \leq y < 0.2$ results in a reduction in the resistance of the material. At a Ce content of about 0.2 or more, although the effect of reducing resistance is provided, a Seebeck coefficient is low, which generates only a low electromotive force.

E represents one or a plurality of elements preferably including at least Cu, for example.

The composite insulating material is preferably defined by a mixture of an oxide and a glass, for example. The constituents and the composition are appropriately selected in view of, for example, requirements for co-firing with the p-type oxide thermoelectric conversion material and the n-type oxide thermoelectric conversion material.

For example, $Mg_2SiO_4$ (forsterite) may preferably be used as the oxide. Alternatively, $BaTiO_3$ may preferably be used.

With respect to the glass, the constituents are preferably selected such that the softening point is in the range of about 550° C. to about 750° C., for example.

A softening point of the glass of lower than about 550° C. results in diffusion of the constituents of the glass into the thermoelectric conversion material, thereby reducing the output characteristics. Thus, the softening point of the glass is preferably at least about 550° C., for example. A softening point of the glass of about 750° C. or higher results in an increase in the firing temperature of the composite insulating material defined by the oxide and the glass, which causes difficulty in the co-firing of the composite insulating material and the thermoelectric conversion material. Thus, the softening point of the glass is preferably about 750° C. or less, for example.

The glass content of the composite insulating material is not particularly limited as long as the composite insulating material can be co-fired with the oxide thermoelectric materials. A higher glass content may cause diffusion of the constituents of the glass into the thermoelectric conversion materials, thereby reducing the output characteristics. Thus, the glass content of the composite insulating material is preferably about 20% by weight or less, for example.

An example of the glass that can preferably be used in preferred embodiments of the present invention is a $Li_2O$—$ZnO$—$B_2O_3$—$SiO_2$-based glass.

The first and second electrodes 14a and 14b are electrodes defining terminals arranged to output electric power. In the first preferred embodiment, the electrodes are preferably connected to ends of the lower-temperature side. However, the arrangement of the electrodes is not particularly limited to this arrangement. The electrodes may be connected to the higher-temperature side or to both of the lower-temperature side and the higher-temperature side. However, if problems of oxidation of the electrodes and migration arise when the electrodes are connected to the higher-temperature side, the electrodes are preferably connected to the lower-temperature side.

A method for producing the thermoelectric conversion element 10 according to the first preferred embodiment will be described below.

A p-type oxide thermoelectric conversion material sheet preferably primarily made of a p-type oxide thermoelectric conversion material having a layered perovskite structure represented by the formula: $A_2BO_4$ (wherein A includes at least La; and B represents one or a plurality of elements including at least Cu) is formed.

An n-type oxide thermoelectric conversion material sheet preferably primarily made of an n-type oxide thermoelectric conversion material having a layered perovskite structure represented by the formula: $D_2EO_4$ (wherein D includes at least one of Pr, Nd, Sm, and Gd; and E represents one or a plurality of elements including at least Cu) is formed.

A composite insulating material including an oxide and a glass is arranged in a region other than a region of the junction surface between the p-type oxide thermoelectric conversion material sheet and the n-type oxide thermoelectric conversion material sheet. As the composite insulating material, for example, a material including $Mg_2SiO_4$ and glass is preferably used.

A laminate is formed such that the p-type oxide thermoelectric conversion material sheet is directly bonded to the n-type oxide thermoelectric conversion material sheet in the region in which the composite insulating material is not arranged when the p-type oxide thermoelectric conversion material sheet and the n-type oxide thermoelectric conversion material sheet are stacked and such that the p-type oxide thermoelectric conversion material sheet is bonded to the n-type oxide thermoelectric conversion material sheet with the composite insulating material provided therebetween in the region in which the insulating material is arranged.

The laminate is co-fired to co-sinter the p-type oxide thermoelectric conversion material, the n-type oxide thermoelectric conversion material, and the composite insulating material.

Electrodes are formed on the sintered compact that has been co-sintered, to produce the thermoelectric conversion element 10 shown in FIG. 1.

In the thermoelectric conversion element 10 according to the first preferred embodiment, the p-type oxide thermoelectric conversion material 11 and the n-type oxide thermoelectric conversion material 12, which are preferably made of materials having the same crystal structure, are directly bonded. This eliminates the need to arrange an electrode between the p-type oxide thermoelectric conversion material 11 and the n-type oxide thermoelectric conversion material 12, thus eliminating the contact resistance generated at the bonding portions between the electrode and the p-type oxide thermoelectric conversion material and between the electrode and the n-type oxide thermoelectric conversion material.

The p-type oxide thermoelectric conversion material 11 and the n-type oxide thermoelectric conversion material 12 are preferably made of the materials having the same crystal structure, thus reducing the contact resistance at the higher-temperature-side junction 15a therebetween as compared to the contact resistance at the junction of different materials.

There is no need to arrange an electrode between the p-type oxide thermoelectric conversion material 11 and the n-type oxide thermoelectric conversion material 12, which eliminates deterioration in the properties caused by oxidation of a metal at the higher-temperature-side junction 15a. It is therefore possible to raise the temperature on the higher-temperature side of the thermoelectric conversion element 10. Furthermore, in the region 16b of the junction surface 16 at which the p-type oxide thermoelectric conversion material 11 is not directly bonded to the n-type oxide thermoelectric conversion material 12, bonding is performed with the insulating material 13 including an oxide and a glass, thereby increasing the density and reducing the size thereof.

Moreover, the p-type oxide thermoelectric conversion material 11 and the n-type oxide thermoelectric conversion material 12 preferably include the materials having the same crystal structure, and the composite insulating material 13 is preferably a composite material defined by an oxide and a glass. This makes it possible to perform co-sintering without using a special firing method or atmosphere, thereby efficiently producing the high-performance thermoelectric conversion element 10.

When using different materials, it is difficult to perform co-sintering unless a special firing method, such as hot pressing, hot isostatic pressing, or discharge plasma sintering, for example, is used. Thus, materials having the same crystal structure are preferably used.

According to the first preferred embodiment described above, it is possible to produce a small, high-performance thermoelectric conversion element which has outstanding impact resistance, a low contact resistance between the p-type thermoelectric conversion material and the n-type thermoelectric conversion material, and which can be used at high temperatures without deterioration of the p-type thermoelectric conversion material and the n-type thermoelectric conversion material due to oxidation.

Second Preferred Embodiment

Figure 2:
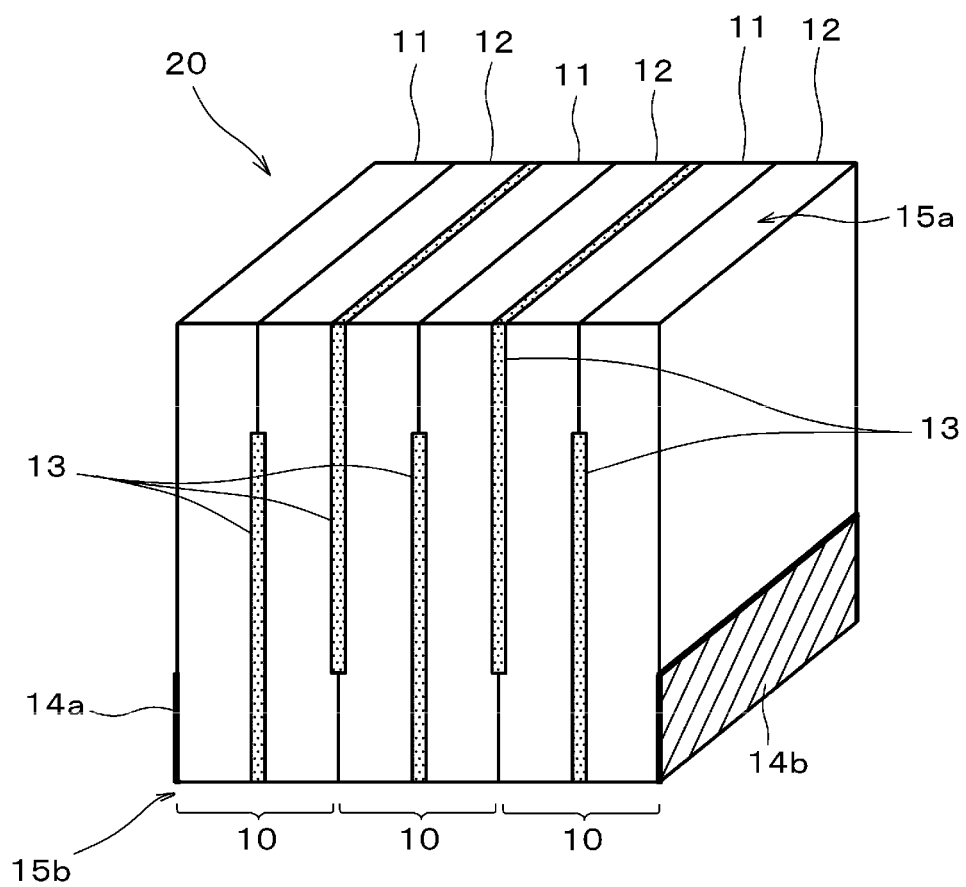
FIG. 2 shows a thermoelectric conversion module according to a second preferred embodiment of the present invention.

FIG. 2 shows a schematic structure of a thermoelectric conversion module according to a second preferred embodiment of the present invention.

A thermoelectric conversion module 20 according to the second preferred embodiment includes a plurality of bonded thermoelectric conversion elements 10 each having one p-type oxide thermoelectric conversion material 11 and one n-type oxide thermoelectric conversion material 12 and first and second electrodes 14a and 14b arranged at lower portions (lower-temperature-side junctions) 15b of both ends thereof.

FIG. 2 shows a structure including three thermoelectric conversion elements 10 each having a pair of the p-type oxide thermoelectric conversion material 11 and the n-type oxide thermoelectric conversion material 12. However, the number of the thermoelectric conversion elements 10 defining the thermoelectric conversion module 20 is not particularly limited.

Each of the thermoelectric conversion elements 10 used in the thermoelectric conversion module 20 according to the second preferred embodiment has the same or substantially the same structure as the thermoelectric conversion element 10 used in the first preferred embodiment. The p-type oxide thermoelectric conversion material 11 and the n-type oxide thermoelectric conversion material 12 defining one thermoelectric conversion element 10 are directly bonded at a higher-temperature-side junction 15a. In another region of the junction surface, the p-type oxide thermoelectric conversion material 11 and the n-type oxide thermoelectric conversion material 12 are bonded to each other with a composite insulating material 13 provided therebetween. The p-type oxide thermoelectric conversion material 11 of one thermoelectric conversion element 10 is directly bonded to the n-type oxide thermoelectric conversion material 12 of the adjacent thermoelectric conversion element 10 at a lower-temperature-side junction 15b. That is, the p-type oxide thermoelectric conversion material is also directly bonded to the n-type oxide thermoelectric conversion material between adjacent thermoelectric conversion elements 10.

The thermoelectric conversion module 20 according to the second preferred embodiment can be produced by a method similar to the method for producing the thermoelectric conversion element 10 in the first preferred embodiment.

Specifically, the module is produced by the steps of preparing a desired number of pieces of the p-type oxide thermoelectric conversion material 11, a desired number of pieces of the n-type oxide thermoelectric conversion material 12, and a desired number of the composite insulating material and bonding them such that the structure shown in FIG. 2 is obtained.

According to the second preferred embodiment described above, it is possible to produce the small thermoelectric conversion module 20 having good impact resistance and high conversion efficiency and including a plurality of the small, high-performance thermoelectric conversion elements 10 according to the first preferred embodiment described above, each of the thermoelectric conversion elements 10 having a low contact resistance between the p-type thermoelectric conversion material and the n-type thermoelectric conversion material and being capable of being used at high temperatures without deterioration of the p-type thermoelectric conversion material and the n-type thermoelectric conversion material due to oxidation.

EXAMPLES

Examples of preferred embodiments of the present invention will be described below.

Here, an insulating material to be interposed between a p-type thermoelectric conversion material and an n-type thermoelectric conversion material was first studied when producing a thermoelectric conversion module according to an example of a preferred embodiment of the present invention.

Specifically, glass A, glass B, glass C, glass D, glass E, and glass F, having different softening points, shown in Table 1 below were prepared. Thermoelectric conversion modules were produced using materials each including one of the glasses and an oxide (forsterite ($Mg_2SiO_4$) powder, for example) as insulating materials. The effect of the softening point of the glass and the optimum ratio of the glass powder to the forsterite powder were studied.

Effect of Softening Point of Glass

Thermoelectric conversion materials and insulating materials described below were prepared.
(a) p-type thermoelectric conversion material: $(La_{1.97}Sr_{0.03})CuO_4$
(b) n-type thermoelectric conversion material: $(Pr_{1.95}Ce_{0.05})CuO_4$
(c) insulating materials: $Mg_2SiO_4$ powder and $Li_2O$—$ZnO$—$B_2O_3$—$SiO_2$-based glass powders As the above-described glass powders, six different glasses, glass A, glass B, glass C, glass D, glass E, and glass F, which have different compositions and thus have different softening points of about 520° C. to about 810° C. were prepared (see Table 1).

Mixtures each including one of the glass powders and forsterite ($Mg_2SiO_4$) powder mixed in a ratio of the glass powder to the forsterite ($Mg_2SiO_4$) powder of 17.5:82.5 (weight ratio) were used as insulating materials (composite insulating materials).

Production of Thermoelectric Conversion Module

Thermoelectric conversion modules each including eight pairs of pn junctions were produced with the p-type thermoelectric conversion material, the n-type thermoelectric conversion material, and the insulating materials.

The thermoelectric conversion modules were fired at about 975° C. to about 1020° C. in air. The occurrence of cracking or delamination of the elements was investigated.

Specifically, 10 samples of thermoelectric conversion modules of each of the different compositions were produced. A condition in which cracking or delamination of the element had occurred in any of the samples was evaluated as unacceptable. A condition in which no cracking or delamination of the element had occurred in any of the 10 samples was evaluated as acceptable.

Table 1 shows the results:

TABLE 1

| | Type of glass | | | | | |
| --- | --- | --- | --- | --- | --- | --- |
| | Glass A | Glass B | Glass C | Glass D | Glass E | Glass F |
| Softening point (° C.) | 520 | 550 | 610 | 700 | 750 | 810 |
| Occurrence of cracking or delamination of element | Unacceptable | Acceptable | Acceptable | Acceptable | Acceptable | Unacceptable |

Table 1 shows that a softening point of the glass of less than about 550° C. causes cracking or delamination of the element due to the diffusion of constituent elements of the glass into the element and a reduction in the firing temperature of the composite insulating material, which is not preferred.

A softening point of the glass exceeding about 750° C. resulted in an increase in the firing temperature of the composite insulating material defined by the glass and $Mg_2SiO_4$ and difficulty in the co-firing of the composite insulating material and the thermoelectric conversion materials, thereby causing cracking or delamination.

Data on Optimized Ratio of Glass Powder to $Mg_2SiO_4$ Powder

Insulating materials including glass C having a softening point of about 610° C. shown in Table 1 and the $Mg_2SiO_4$ powder in different ratios of about 0:100 to about 30:70 were prepared. Thermoelectric conversion modules each including eight pairs of pn junctions were produced with the same p-type thermoelectric conversion material and n-type thermoelectric conversion material as in item (1) described above. The occurrence of cracking or delamination of the elements was investigated.

Specifically, 10 samples of thermoelectric conversion modules of each of the different compositions were produced. A condition in which cracking or delamination of the element had occurred in any of the samples was evaluated as unacceptable. A condition in which no cracking or delamination of the element had occurred in any of all 10 samples was evaluated as acceptable.

Table 2 shows the results:

TABLE 2

| | Condition | | | | | | | |
|---|---|---|---|---|---|---|---|---|
| | 1 | 2 | 3 | 4 | 5 | 6 | 7 | 8 |
| Glass powder (wt %) | 0 | 5 | 10 | 15 | 17.5 | 20 | 25 | 30 |
| $Mg_2SiO_4$ powder (wt %) | 100 | 95 | 90 | 85 | 82.5 | 80 | 75 | 70 |
| Occurrence of cracking or delamination of element | Unacceptable | Acceptable | Acceptable | Acceptable | Acceptable | Acceptable | Acceptable | Unacceptable |

Table 2 shows that the mixing ratio of the glass powder to the $Mg_2SiO_4$ powder is preferably in the range of about 5:95 to about 25:75 (weight ratio), for example.

A glass content exceeding about 25% by weight caused the occurrence of cracking or delamination due to the diffusion of constituent elements of the glass into the element and a reduction in the firing temperature of the composite insulating material, which is not preferred.

A glass content of less than about 5% by weight resulted in an increase in the firing temperature of the composite insulating material defined by the glass and $Mg_2SiO_4$ and difficulty in the co-firing of the composite insulating material and the thermoelectric conversion materials, thereby causing cracking or delamination.

Production of Thermoelectric Conversion Modules (Samples 1 and 2)

$La_2O_3$, $SrCO_3$, and $CuO$ were prepared as raw materials for a p-type thermoelectric conversion material.

$Pr_6O_{11}$, $CeO_2$, and $CuO$ or $Nd_2O_3$, $CeO_2$, and $CuO$ were prepared as raw materials for an n-type thermoelectric conversion material.

These raw materials were weighed so as to achieve compositions shown in Table 3.

TABLE 3

| | P-type oxide thermoelectric conversion material | N-type oxide thermoelectric conversion material |
|---|---|---|
| Sample 1 (example) | $(La_{1.97}Sr_{0.03})CuO_4$ | $(Pr_{1.95}Ce_{0.05})CuO_4$ |
| Sample 2 (example) | $(La_{1.97}Sr_{0.03})CuO_4$ | $(Nd_{1.97}Ce_{0.03})CuO_4$ |

Deionized water was added as a solvent to these powders. The resulting mixtures were mixed for about 16 hours by ball milling to form slurries. The slurries were dried and then calcined at about 900° C. in air.

The calcined powders were pulverized for about 40 hours by ball milling. Deionized water, a binder, and suitable ingredients were added to the resulting powders to form slurries.

The resulting slurries were formed into sheets by a doctor blade method, thereby producing about 50-μm-thick p-type oxide thermoelectric conversion material sheets and about 50-μm-thick n-type oxide thermoelectric conversion material sheets.

With respect to a composite insulating material, a $Mg_2SiO_4$ powder, a glass powder, varnish, and a solvent were mixed. The mixture was processed with a roll mill to form an insulating paste.

A $Li_2O$—$ZnO$—$B_2O_3$—$SiO_2$-based glass powder having a softening point of about 610° C. was used as the glass powder. The insulating paste had a mixing ratio of the glass powder to the $Mg_2SiO_4$ powder of about 17.5:82.5 (weight ratio).

The resulting insulating paste was applied by printing on the resulting p-type oxide thermoelectric conversion material sheets and the n-type oxide thermoelectric conversion material sheets to form about 10-μm-thick films.

Then four p-type oxide thermoelectric conversion material sheets on which the insulating paste had not been applied by printing, one p-type oxide thermoelectric conversion material sheet on which the insulating paste was applied by printing to form the about 10-μm-thick film, four n-type oxide thermoelectric conversion material sheets on which the insulating paste had not been applied by printing, and one n-type oxide thermoelectric conversion material sheet on which the insulating paste was applied by printing to form the about 10-μm-thick film were stacked, in that order, to form a stack. Twenty-five stacks were alternately stacked to form a laminate.

The resulting laminate was press-bonded by isostatic pressing at about 200 MPa and cut into pieces each having a predetermined size with a dicing saw, thereby producing green compacts.

The resulting compacts were calcined at about 480° C. and then fired in air at about 900° C. to about 1050° C. to produce fired compacts.

After polishing the resulting fired compacts, a Ag paste was applied to lower ends of both side surfaces by screen printing and baked at about 700° C. to form electrodes arranged to output electric power (in this example, Ag electrodes). Thereby, Samples 1 and 2, which were thermoelectric conversion modules according to preferred embodiments of the present invention, were produced.

Each of the thermoelectric conversion modules of Samples 1 and 2 included 25 thermoelectric conversion elements each having the same or substantially the same structure as the thermoelectric conversion element 10 according to the first preferred embodiment and had a structure in which, similar to the thermoelectric conversion module 20 according to the second preferred embodiment shown in FIG. 2, the p-type oxide thermoelectric conversion material of one thermoelectric conversion element was directly bonded to the n-type oxide thermoelectric conversion material of adjacent thermoelectric conversion element.

Production of Thermoelectric Conversion Module (Sample 3) for Comparison

For comparison with the thermoelectric conversion modules described above, Sample 3 for comparison was produced by a method described below.

La$_2$O$_3$, SrCO$_3$, and CuO were prepared as raw materials for a p-type oxide thermoelectric conversion material.

Pr$_6$O$_{11}$, CeO$_2$, and CuO were prepared as raw materials for an n-type oxide thermoelectric conversion material.

These raw materials were weighed so as to achieve compositions shown in Table 4.

TABLE 4

|  | P-type oxide thermoelectric conversion material | N-type oxide thermoelectric conversion material |
|---|---|---|
| Sample 3 (comparative example) | (La$_{1.97}$Sr$_{0.03}$)CuO$_4$ | (Pr$_{1.95}$Ce$_{0.05}$)CuO$_4$ |

Deionized water was added as a solvent to these powders. The resulting mixtures were mixed for about 16 hours by ball milling to form slurries. The slurries were dried and then calcined at about 900° C. in air. A binder was added to the resulting powders. Each of the resulting mixtures was stirred for about 16 hours by ball milling using deionized water as a solvent.

The resulting slurries were dried and shaped with a press machine at about 1000 kg/cm$^2$.

The resulting green compacts, i.e., green compacts to be formed into pieces of the p-type oxide thermoelectric conversion material and green compacts to be formed into pieces of the n-type oxide thermoelectric conversion material, were degreased at about 400° C. and then fired in air at about 900° C. to about 1050° C.

Each of the fired compacts (the p-type oxide thermoelectric conversion material 11 and the n-type oxide thermoelectric conversion material 12 (see FIG. 3)) was cut into pieces measuring about 2.4 mm×about 1.4 mm×about 3.6 mm.

Then Ag electrodes 18 were formed by screen printing on Al$_2$O$_3$ plates 19 each having a size of about 25 mm×about 25 mm and a thickness of about 500 μm such that the pieces of the p-type oxide thermoelectric conversion material 11 and the pieces of the n-type oxide thermoelectric conversion material 12 were spaced at intervals of about 1.5 mm and 24 pairs of pn junctions were formed. The pieces of the p-type oxide thermoelectric conversion material 11 and the pieces of the n-type oxide thermoelectric conversion material 12 were interposed between the Al$_2$O$_3$ plates 19 and baked at about 700° C. to bond the thermoelectric conversion materials.

Figure 3:
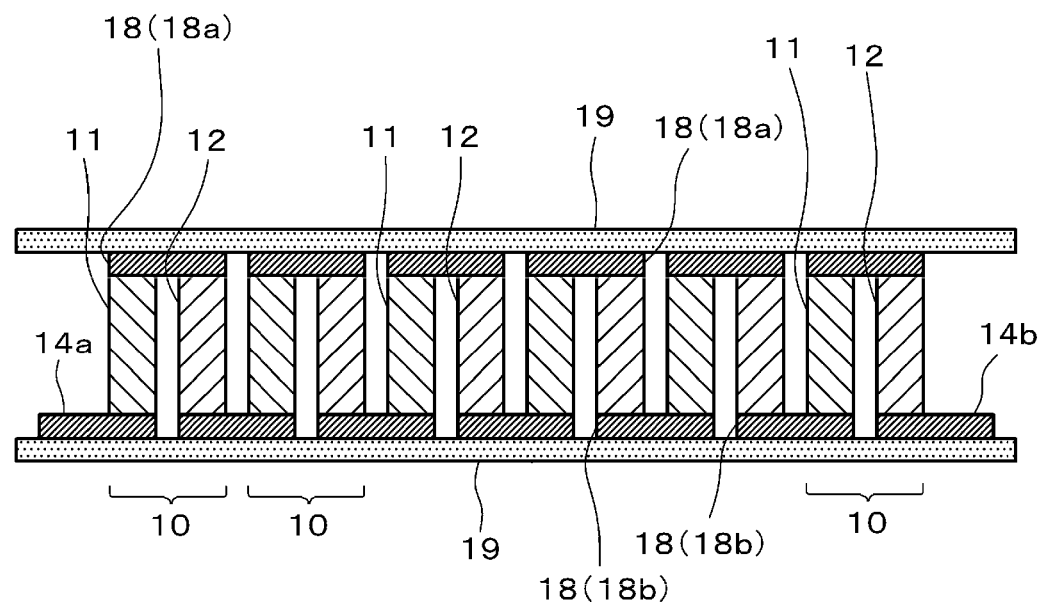
FIG. 3 shows a thermoelectric conversion element according to a comparative example, the element being produced for comparison with a thermoelectric conversion element according to preferred embodiments of the present invention.

Thereby, a thermoelectric conversion module (Sample 3) according to a comparative example as shown in FIG. 3 was produced, the thermoelectric conversion module including 24 thermoelectric conversion elements 10 (only a single row of six elements is shown in FIG. 3) each having the p-type oxide thermoelectric conversion material 11 and the n-type oxide thermoelectric conversion material 12 connected to each other with a connection electrode 18$a$, and the thermoelectric conversion device having a structure in which the p-type oxide thermoelectric conversion material 11 of one thermoelectric conversion element 10 was connected to the n-type oxide thermoelectric conversion material 12 of the adjacent thermoelectric conversion element 10 with a connection electrode 18$b$ on a lower-temperature side and in which the first and second electrodes 14$a$ and 14$b$ arranged to output electric power were arranged on both ends.

Production of Thermoelectric Conversion Module (Sample 4) for Comparison

Although an attempt was made to produce a thermoelectric conversion module (Sample 4) for comparison by a method described below, delamination occurred in a firing step as described below, thus preventing the intended thermoelectric conversion module from being produced.

NiO was prepared as a raw material for a p-type oxide thermoelectric conversion material. ZnO was prepared as a raw material for an n-type oxide thermoelectric conversion material.

Deionized water was added as a solvent to powders thereof. The mixtures were pulverized for about 40 hours by ball milling. Deionized water, a binder, and other ingredients were added to the resulting powders. The mixtures were stirred to form slurries.

The resulting slurries were formed into sheets by a doctor blade method, thereby producing p-type oxide thermoelectric conversion material sheets and n-type oxide thermoelectric conversion material sheets.

With respect to a composite insulating material, a Mg$_2$SiO$_4$ powder, a glass powder, varnish, and a solvent were mixed. The mixture was processed with a roll mill to form an insulating paste. A Li$_2$O—ZnO—B$_2$O$_3$—SiO$_2$-based glass powder having a softening point of about 610° C. was also used as the glass powder. The insulating paste had a mixing ratio of the glass powder to the Mg$_2$SiO$_4$ powder of about 17.5:82.5 (weight ratio).

The insulating paste was applied by printing on the resulting p-type oxide thermoelectric conversion material sheets and the n-type oxide thermoelectric conversion material sheets to form about 10-μm-thick films.

Then four p-type oxide thermoelectric conversion material sheets on which the insulating paste had not been applied by printing, one p-type oxide thermoelectric conversion material sheet on which the insulating paste was applied by printing to form the about 10-μm-thick film, four n-type oxide thermoelectric conversion material sheets on which the insulating paste had not been applied by printing, and one n-type oxide thermoelectric conversion material sheet on which the insulating paste was applied by printing to form the about 10-μm-thick film were stacked, in that order, to form a stack. Twenty-five stacks were alternately stacked to form a laminate.

The resulting laminate was press-bonded by isostatic pressing at about 200 MPa and cut into pieces each having a predetermined size with a dicing saw, thereby producing green compacts.

The resulting compacts were degreased at about 480° C. and then fired in air at about 900° C. to about 1400° C.

However, there was a significant difference in shrinking behavior between NiO and ZnO defining the compacts in the firing step. Thus, delamination occurred during firing, thereby failing to produce a sample capable of being evaluated for characteristics.

Samples 1 and 2, which were the thermoelectric conversion modules produced as described above according to examples of preferred embodiments of the present invention, and Sample 3, which was the thermoelectric conversion module in the comparative example, were examined for no-load electromotive force, output by thermoelectric conversion, size, and strength and evaluated for their characteristics.

To evaluate the characteristics, the temperatures of each of the samples of the example and the sample of the comparative example were adjusted such that the lower end located on the lower-temperature side had a temperature of about 20° C. and the upper end located on the higher-temperature side had a temperature of about 400° C.

The no-load electromotive force was measured in this state with an electronic load device. Next, the voltage and the current were measured by changing a load connected to the thermoelectric conversion element with the electronic load device to calculate the output.

Dimensions of each sample were measured with a micrometer.

Each sample was dropped from about 1 m above the ground to check, for example, for the presence or absence of delamination of the electrode, thereby evaluating the impact resistance.

Table 5 shows the evaluation results of the electromotive force, output, area dimensions, output per unit area, and strength in the drop test at a temperature difference of about 380° C.

TABLE 5

| | No-load electromotive force (V) | Output (W) | Area dimensions (cm × cm) | Output per unit area (W/cm$^2$) | Impact resistance in drop test |
|---|---|---|---|---|---|
| Sample 1 (example) | 1.35 | 0.0063 | 0.8 × 1.0 | 0.0079 | Good |
| Sample 2 (example) | 1.85 | 0.0213 | 0.7 × 1.0 | 0.0304 | Good |
| Sample 3 (comparative example) | 0.80 | 0.0310 | 2.5 × 2.5 | 0.0050 | Poor |

The area dimensions shown in Table 5 indicate the dimensions of length×width of each sample in plan view. The output per unit area is a value obtained by dividing the output by the area.

Table 5 demonstrated that in the case of Sample 3 of the comparative example, although the output was high, the area was also large. Thus, the output per unit area was only about 0.0050 W/cm$^2$.

In the case of Sample 3 of the comparative example, the results further demonstrated that the detachment of the electrode in the drop test caused Sample 3 to fail to establish electrical connection.

In contrast, in each of Samples 1 and 2, the results demonstrated the following: The thermoelectromotive force and the output per unit area were superior to those of Sample 3 of the comparative example. No damage, such as electrode delamination, was observed in the drop test. Thus, no problems existed with respect to electrical connection.

Figure 4:
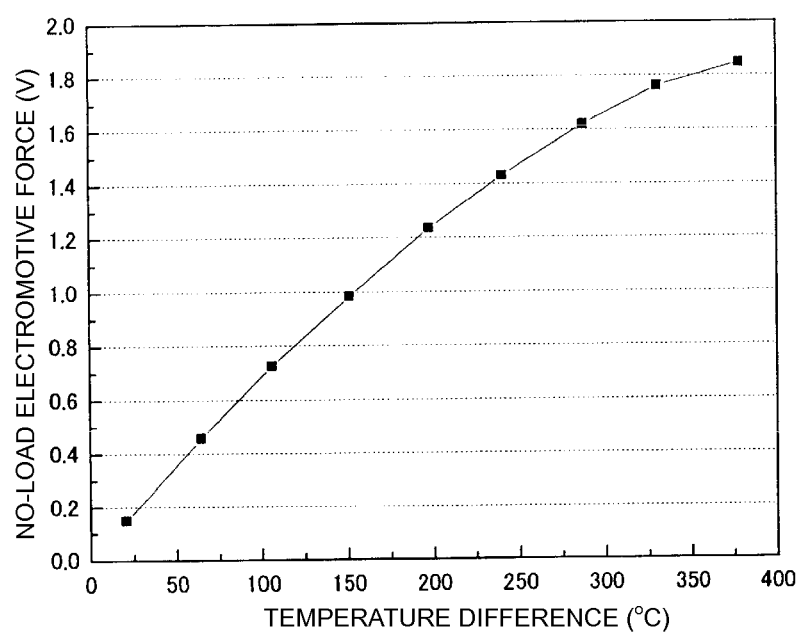
FIG. 4 shows the relationship between the temperature difference and the no-load electromotive force of a thermoelectric conversion element according to a preferred embodiment of the present invention.

With respect to Sample 2, the relationship between the temperature difference and the no-load electromotive force is shown in FIG. 4, and the output characteristics are shown in FIG. 5.

FIGS. 4 and 5 show that the thermoelectric conversion module of Sample 2 according to an example of a preferred embodiment of the present invention had satisfactory thermoelectric conversion characteristics. Note that Sample 1 according to an example of a preferred embodiment of the present invention also had thermoelectric conversion characteristics similar to Sample 2.

The present invention is not limited to the preferred embodiments described above. With respect to the compositions and raw materials of the p-type oxide thermoelectric conversion material and the n-type oxide thermoelectric conversion material, types of raw materials defining the composite insulating material, the glass content, specific structures of the thermoelectric conversion element and the thermoelectric conversion module, and specific production conditions (e.g., the dimensions, the firing conditions, the number of thermoelectric conversion elements defining the thermoelectric conversion module), variations and modifications can be made within the scope of the invention.

As described above, according to preferred embodiments of the present invention, it is possible to produce a thermoelectric conversion element and a thermoelectric conversion module having satisfactory characteristics, a low contact resistance between a p-type thermoelectric conversion material and a n-type thermoelectric conversion material, and being capable of being used at high temperatures without deterioration of the p-type thermoelectric conversion material and the n-type thermoelectric conversion material due to oxidation.

Thus, preferred embodiments of the present invention can be widely applied to cases in which the direct conversion of heat into electricity is required in various technical fields.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A thermoelectric conversion element comprising:
a p-type oxide thermoelectric conversion material and an n-type oxide thermoelectric conversion material; wherein
the p-type oxide thermoelectric conversion material is directly bonded to the n-type oxide thermoelectric conversion material in one region of a junction surface between the p-type oxide thermoelectric conversion material and the n-type oxide thermoelectric conversion material;
the p-type oxide thermoelectric conversion material is bonded to the n-type oxide thermoelectric conversion material with an insulating material provided therebetween in another region of the junction surface;
the p-type oxide thermoelectric conversion material, the n-type oxide thermoelectric conversion material, and the insulating material are co-sintered;
the insulating material includes $Li_2O$—$ZnO$-$B_2O_3$—$SiO_2$-based a glass and forsterite;
the glass has a softening point of about 550° C. to about 750° C.;
the p-type oxide thermoelectric conversion material is primarily made of a substance having a layered perovskite structure represented by the formula: $A_2BO_4$, wherein A includes at least La, and B represents at least one element including at least Cu; and
the n-type oxide thermoelectric conversion material is primarily made of a substance having a layered perovskite structure represented by the formula: $D_2EO_4$, wherein D includes at least one of Pr and Nd, and E represents at least one element including at least Cu.

2. The thermoelectric conversion element according to claim 1, wherein the p-type oxide thermoelectric conversion material, the n-type oxide thermoelectric conversion material, and the insulating material are co-sintered in air.

3. A thermoelectric conversion module comprising a plurality of the thermoelectric conversion elements according to claim 1.

4. The thermoelectric conversion element according to claim 1, wherein the glass included in the insulating material is not diffused into the n-type oxide thermoelectric conversion material and the p-type oxide thermoelectric conversion material due to a composition and the softening point of the glass.

* * * * *